(12) United States Patent
Nakamura et al.

(10) Patent No.: US 11,190,278 B2
(45) Date of Patent: Nov. 30, 2021

(54) OPTICAL RECEPTION APPARATUS AND CONTROL METHOD

(71) Applicant: NEC Corporation, Tokyo (JP)

(72) Inventors: Tatsuya Nakamura, Tokyo (JP); Junichi Abe, Tokyo (JP)

(73) Assignee: NEC CORPORATION, Tokyo (JP)

(*) Notice: Subject to any disclaimer, the term of this patent is extended or adjusted under 35 U.S.C. 154(b) by 433 days.

(21) Appl. No.: 16/338,733

(22) PCT Filed: Aug. 25, 2017

(86) PCT No.: PCT/JP2017/030533
§ 371 (c)(1),
(2) Date: Apr. 2, 2019

(87) PCT Pub. No.: WO2018/066263
PCT Pub. Date: Apr. 12, 2018

(65) Prior Publication Data
US 2021/0288721 A1    Sep. 16, 2021

(30) Foreign Application Priority Data

Oct. 6, 2016    (JP) .............................. JP2016-197914

(51) Int. Cl.
*H04B 10/61* (2013.01)
*H03M 13/45* (2006.01)
(Continued)

(52) U.S. Cl.
CPC ...... *H04B 10/6165* (2013.01); *H03M 13/458* (2013.01); *H04B 10/6164* (2013.01); *H04L 27/38* (2013.01); *G06K 9/6277* (2013.01)

(58) Field of Classification Search
CPC . H04B 10/6165; H04B 10/6164; H04L 27/38; H03M 13/458; G06K 9/6277
See application file for complete search history.

(56) References Cited

U.S. PATENT DOCUMENTS

| 4,755,998 A | 7/1988 | Gallager |
| 2005/0105795 A1 | 5/2005 | Singh et al. |
| 2016/0211939 A1* | 7/2016 | Yu .......................... H04L 27/34 |

FOREIGN PATENT DOCUMENTS

JP    2005202932 A    7/2005

OTHER PUBLICATIONS

International Search Report, dated Nov. 14, 2017 from the International Bureau in counterpart International application No. PCT/JP2017/030533.

(Continued)

*Primary Examiner* — Thien Nguyen
(74) *Attorney, Agent, or Firm* — Sughrue Mion, PLLC

(57) ABSTRACT

A receiving unit (2020) generates a received frame from a modulated optical signal. The modulated optical signal is generated such that a transmission symbol is generated by mapping an encoded bit string obtained by encoding a transmission bit string to an m-dimensional symbol space, a transmission frame is generated by mapping the transmission symbol to an n-dimensional frame space (n<m), and an optical carrier wave is modulated by using the transmission frame. A converting unit (2040) generates candidate vectors (m-dimensional vectors belonging to a partial symbol space within the symbol space) by using a received frame. A first computing unit (2070) computes a probability of that the transmission symbol belonging to the partial symbol space is transmitted for each partial symbol space. A second computing unit (2080) computes a log-likelihood ratio of each bit of the encoded bit string by using the probability.

4 Claims, 7 Drawing Sheets

(51) Int. Cl.
*H04L 27/38* (2006.01)
*G06K 9/62* (2006.01)

(56) References Cited

OTHER PUBLICATIONS

Nakamura, T., et al., "Gyaku Fugoka o Mochiita 4D-SP64-12QAM Fugoka Hencho ni okeru LLR Sanshutsuho", 2016, Nen IEICE Communications Society Conference Koen Ronbunshu 2, Sep. 6, 2016, p. 231, (2 pages).
Strohmer, T., et al., "Grassmannian Frames with Applications to Coding and Communication", Applied and Computational Harmonic Analysis, vol. 14, No. 3, May 2003, pp. 1-28.

\* cited by examiner

OPTICAL RECEPTION APPARATUS AND CONTROL METHOD

This application is a National Stage Entry of PCT/JP2017/030533 filed on Aug. 25, 2017, which claims priority from Japanese Patent Application 2016-197914 filed on Oct. 6, 2016, the contents of all of which are incorporated herein by reference, in their entirety.

TECHNICAL FIELD

The present invention relates to an optical reception apparatus and a control method.

BACKGROUND ART

In many cases, a forward error correcting code is used in order to secure the reliability of communication in a communication system. Particularly, a low-density parity check (LDPC) code or a turbo code with error correction capability is used in a large capacity core transmission system. A transmission apparatus encodes transmission data by applying the forward error correcting code to data to be transmitted to a reception apparatus.

There is a need to use soft-decision information in order to sufficiently demonstrate the performance of the error correcting code such as the LDPC code. A log-likelihood ratio (LLR) of each bit is used as the soft-decision information. The log-likelihood ratio is an index representing a likelihood of a value for each bit. The reception apparatus obtains the transmission data transmitted by the transmission apparatus by performing the soft-decision decoding using the soft-decision information.

Since communication traffic increases due to the popularization of video contents and Internet of Things (IoT), there is a need to increase the capacity of the communication system. The communication method using the over-complete frame is suggested as a method. Patent Document 1 suggests a method of adding transmission information to the over-complete frame. In the communication method using the over-complete frame, information items larger than the number of dimensions of a symbol can be transmitted for a one-symbol time.

RELATED DOCUMENT

Patent Document

[Non-Patent Document 1] T. Strohmer et al., "Grassmannian frames with applications to coding and communication", Applied and Computational Harmonic Analysis, 14(3), pp. 257-275, May 2003.

SUMMARY OF THE INVENTION

Technical Problem

A method of generating the soft-decision information for the communication method using the over-complete frame has not been suggested yet. Thus, the transmission data cannot be obtained by using the soft-decision decoding in the reception apparatus that performs communication in the communication method using the over-complete frame.

The present invention has been made in view of the problems. An object of the present invention is to provide a technology for performing soft-decision decoding in a communication method using an over-complete frame.

Solution to Problem

An optical reception apparatus of the present invention includes (1) a receiving unit that generates an n-dimensional received vector by receiving and demodulating a modulated optical signal.

The modulated optical signal is generated by: generating a first transmission vector by mapping an encoded bit string obtained by encoding a transmission bit string to an m-dimensional first vector space; generating a second transmission vector by mapping the first transmission vector to an n-dimensional second vector space (n<m); and modulating an optical carrier wave using the second transmission vector.

A plurality of partial spaces different from each other is determined in the first vector space due to a restriction on a value of the first transmission vector in the first vector space.

The optical reception apparatus of the present invention further includes (2) a converting unit that converts the received vector into a plurality of m-dimensional candidate vectors belonging to the partial spaces different from each other, (3) a first computing unit that computes a probability in which the first transmission vector belonging to each partial space is transmitted by using the candidate vector belonging to each partial space and the received vector for each partial space, (4) a second computing unit that computes a log-likelihood ratio of each bit of the encoded bit string by using the probability, and (5) a decoding unit that computes the transmission bit string by using the computed log-likelihood ratio.

A control method of the present invention is performed by a computer.

The control method includes (1) a receiving step of generating an n-dimensional received vector by receiving and demodulating a modulated optical signal.

The modulated optical signal is generated by: generating a first transmission vector by mapping an encoded bit string obtained by encoding a transmission bit string to an m-dimensional first vector space; generating a second transmission vector by mapping the first transmission vector to an n-dimensional second vector space (n<m); and modulating an optical carrier wave using the second transmission vector.

A plurality of partial spaces different from each other is determined in the first vector space due to a restriction on a value of the first transmission vector in the first vector space.

The control method of the present invention further includes
(2) a converting step of converting the received vector into a plurality of m-dimensional candidate vectors belonging to the partial spaces different from each other, (3) a first computing step of computing a probability in which the first transmission vector belonging to each partial space is transmitted by using the candidate vector belonging to each partial space and the received vector for each partial space, (4) a second computing step of computing a log-likelihood ratio of each bit of the encoded bit string by using the probability, and (5) a decoding step of computing the transmission bit string by using the computed log-likelihood ratio.

Advantageous Effects of Invention

According to the present invention, there is provided a technology for performing soft-decision decoding in a communication method using an over-complete frame.

There is provided a technology for lightening soft-decision processing.

BRIEF DESCRIPTION OF THE DRAWINGS

These and other objects, features, and advantages will become more apparent from the following preferred example embodiments and the accompanying drawings.

DESCRIPTION OF EMBODIMENTS

Hereinafter, an example embodiment of the present invention will be described with reference to the drawings. Note that, the same components will be assigned the same reference signs in all the drawings, and the description thereof will be appropriately repeated. In each block diagram, each block represents not a configuration of a hardware unit but a configuration of a functional unit unless otherwise noted.

Example Embodiment 1

<Outline>

Figure 1:
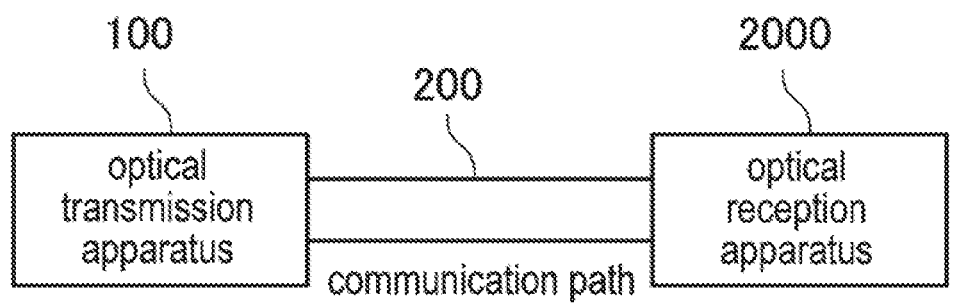
FIG. 1 is a block diagram illustrating an optical reception apparatus of Example Embodiment 1 together with the usage environment thereof.

FIG. 1 is a block diagram illustrating an optical reception apparatus 2000 of Example Embodiment 1 together with the usage environment thereof. An optical communication system 1000 includes an optical transmission apparatus 100, a communication path 200, and the optical reception apparatus 2000. The optical transmission apparatus 100 transmits a modulated optical signal, which is an optical carrier wave modulated based on data to be transmitted to the optical reception apparatus 2000. The optical reception apparatus 2000 may obtain the data by receiving the modulated optical signal through the optical transmission apparatus 100.

Hereinafter, an outline of the optical transmission apparatus 100 that transmits the modulated optical signal to the optical reception apparatus 2000 will be described first.

The optical transmission apparatus 100 generates an encoded bit string B={b1, b2, . . . } by applying a forward error correcting code (such as an LDPC code or a turbo code) to a bit string (transmission bit string) A={a1, a2, . . . } that represents data to be transmitted to the optical reception apparatus 2000.

The optical transmission apparatus 100 generates a first vector S={s1, s2, . . . , sm} by mapping the encoded bit string to an m dimensional first vector space. Hereinafter, the first vector space is also referred to as a symbol space. The first vector is also referred to as a transmission symbol.

Subsequently, the optical transmission apparatus 100 generates a second vector Fs={fs1, fs1, . . . , fsn} by mapping the transmission symbol S to an n-dimensional second vector space. Hereinafter, the second vector space is also referred to as a frame space. The second vector is also referred to as a transmission frame.

In this example, m and n are integers which are 2 or more, and the relationship of m>n is satisfied. That is, the transmission frame being the n-dimensional vector represents m number of information items (s1, s1, . . . , sm) that is larger than the number of dimensions thereof. The transmission frame is also called an over-complete frame. Note that, the upper limit of m is $n^2$.

The optical transmission apparatus 100 generates the modulated optical signal by modulating the optical carrier wave in the transmission frame. The optical transmission apparatus 100 outputs the modulated optical signal to the communication path 200.

As stated above, the optical transmission apparatus 100 generates the n-dimensional transmission frame (n<m) from the m-dimensional transmission symbol, and generates the modulated optical signal by the transmission frame. By so doing, m number of information items (s1, s2, . . . , sm) larger than the number of dimensions n of the transmission frame used in the modulation of the optical carrier wave are included in the modulated optical signal. A communication method of transmitting the information in this manner is a communication method using the over-complete frame.

Figure 2:
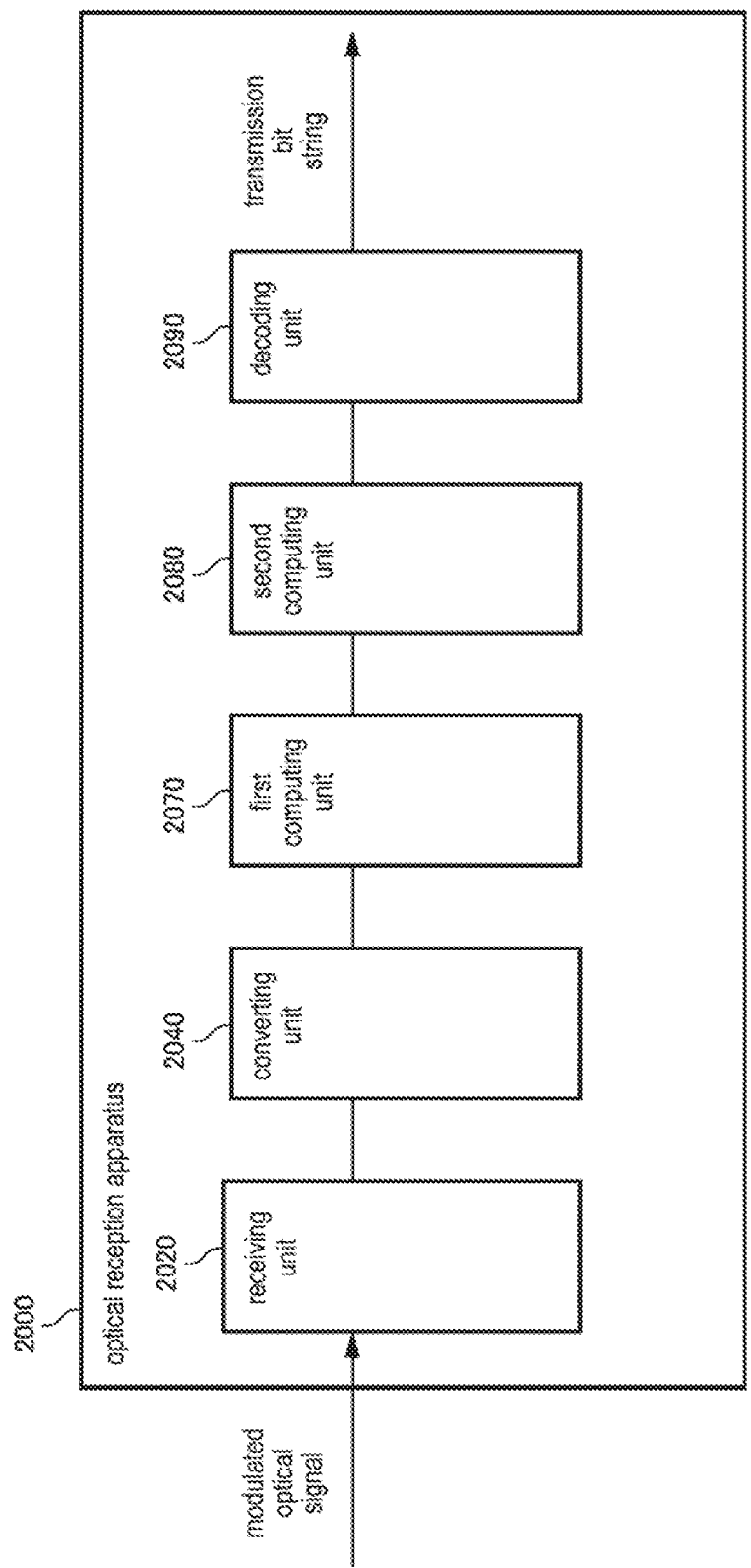
FIG. 2 is a diagram illustrating a configuration of the optical reception apparatus.

Next, an outline of the optical reception apparatus 2000 of the present example embodiment will be described. FIG. 2 is a diagram illustrating a configuration of the optical reception apparatus 2000. The optical reception apparatus 2000 receives the modulated optical signal transmitted by the optical transmission apparatus 100, and computes the transmission bit string A. To do so, the optical reception apparatus 2000 includes a receiving unit 2020, a converting unit 2040, a first computing unit 2070, a second computing unit 2080, and a decoding unit 2090.

The receiving unit 2020 receives the modulated optical signal transmitted by the optical transmission apparatus 100. The receiving unit 2020 generates a received frame Fr={fr1, fr2, . . . , fm} by demodulating the received modulated optical signal.

The converting unit 2040 converts the received frame into a plurality of candidate vectors that are different from each other. The candidate vectors are m-dimensional vectors belonging to any one of a plurality of partial spaces (hereinafter, partial symbol spaces) included in the symbol space. Each candidate vector belongs to a partial symbol space different from each other. The details of the candidate vectors and the partial symbol spaces will be described below.

For each partial symbol space, the first computing unit 2070 computes a probability (hereinafter, a first probability) of that the transmission symbol belonging to that partial symbol space is transmitted. In the computation of the first probability for a certain partial symbol space, the candidate vector belonging to that partial symbol space and the received frame are used.

The second computing unit 2080 computes a log-likelihood ratio (LLR) of each bit of the encoded bit string B by using the computed first probability. The LLR is information used for decoding the transmission bit string through soft decision, and is an index representing the likelihood of its value for each bit of the encoded bit string. Hereinafter, the log-likelihood ratio for a certain bit $b_i$ of the encoded bit string is referred to as an LLR($b_i$). The second computing unit 2080 computes the LLR($b_i$) for each bit of the encoded bit string B={b1, b2, . . . }.

The decoding unit 2090 computes the transmission bit string A by performing soft-decision decoding using the computed LLR(bi). Note that, an existing technology can be used as a technology for performing the soft-decision decoding using the log-likelihood ratio.

Through the aforementioned flow, the optical reception apparatus 2000 computes the transmission bit string A from the received modulated optical signal.

Advantageous Effect

As stated above, in the optical communication system 1000, the information items larger than the number of dimensions of the transmission symbol are transmitted for a one-symbol time by the communication method using the over-complete frame. There has been no method of performing the soft-decision decoding in the communication method using the over-complete frame so far.

In contrast, the optical reception apparatus 2000 of the present example embodiment decodes the transmission bit string by computing the log-likelihood ratio used in the soft-decision decoding from the modulated optical signal transmitted in the communication method using the over-complete frame and performing the soft-decision decoding. Thus, it is possible to decode the transmission bit string with higher accuracy by realizing the soft-decision decoding in the communication method using the over-complete frame.

Hereinafter, the present example embodiment will be described in more detail.

<Example of Detailed Configuration of Optical Communication System 1000>

The functional components of the optical transmission apparatus 100 and the optical reception apparatus 2000 are implemented by using, for example, one or more large-scale integration (LSI) circuits. For example, these functional components are respectively implemented in the individual LSI circuits. For example, these functional components may be implemented in one LSI circuit.

Figure 3:
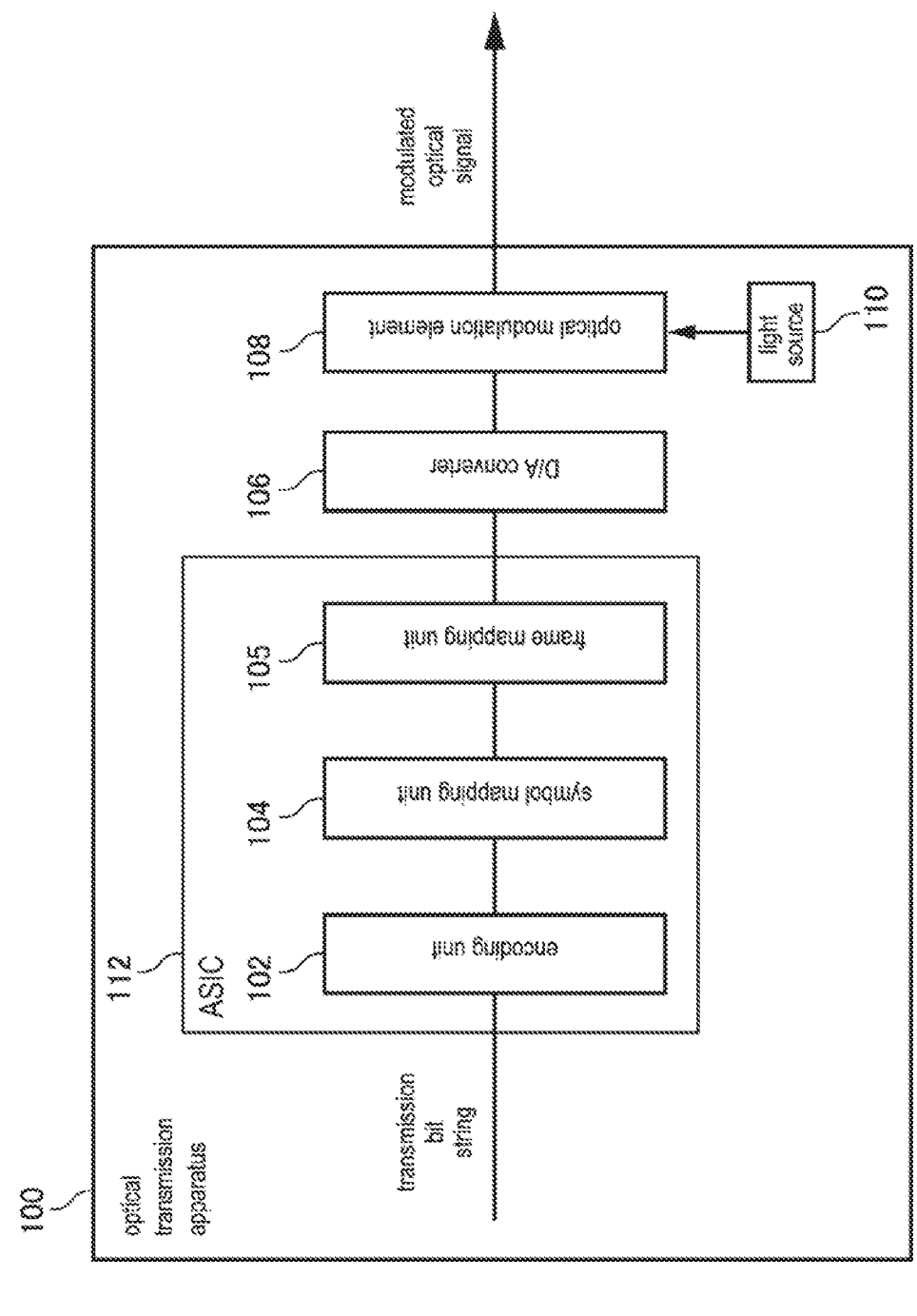
FIG. 3 is a diagram illustrating the detailed configuration of an optical transmission apparatus.

FIG. 3 is a diagram illustrating the detailed configuration of the optical transmission apparatus 100. The optical transmission apparatus 100 includes an encoding unit 102, a symbol mapping unit 104, a frame mapping unit 105, a digital-to-analog converter 106, an optical modulation element 108, and a light source 110.

The encoding unit 102 generates the encoded bit string B by applying the error correcting code to the transmission bit string A. The symbol mapping unit 104 generates the transmission symbols S from the encoded bit string B. The frame mapping unit 105 generates the transmission frame Fs from the transmission symbol S. The encoding unit 102, the symbol mapping unit 104, and the frame mapping unit 105 are implemented on an application specific integrated circuit (ASIC) 112.

The digital-to-analog converter 106 converts a digital signal representing the transmission frame string Fs output from the frame mapping unit 105, into an analog signal. Note that, the digital-to-analog converter 106 may be implemented on the application specific integrated circuit (ASIC) 112.

The optical modulation element 108 generates the modulated optical signal by modulating laser light output from the light source 110 by using the analog signal output from the digital-to-analog converter 106. The light source 110 is realized by, for example, a laser oscillator, and oscillates laser light as the optical carrier wave.

Figure 4:
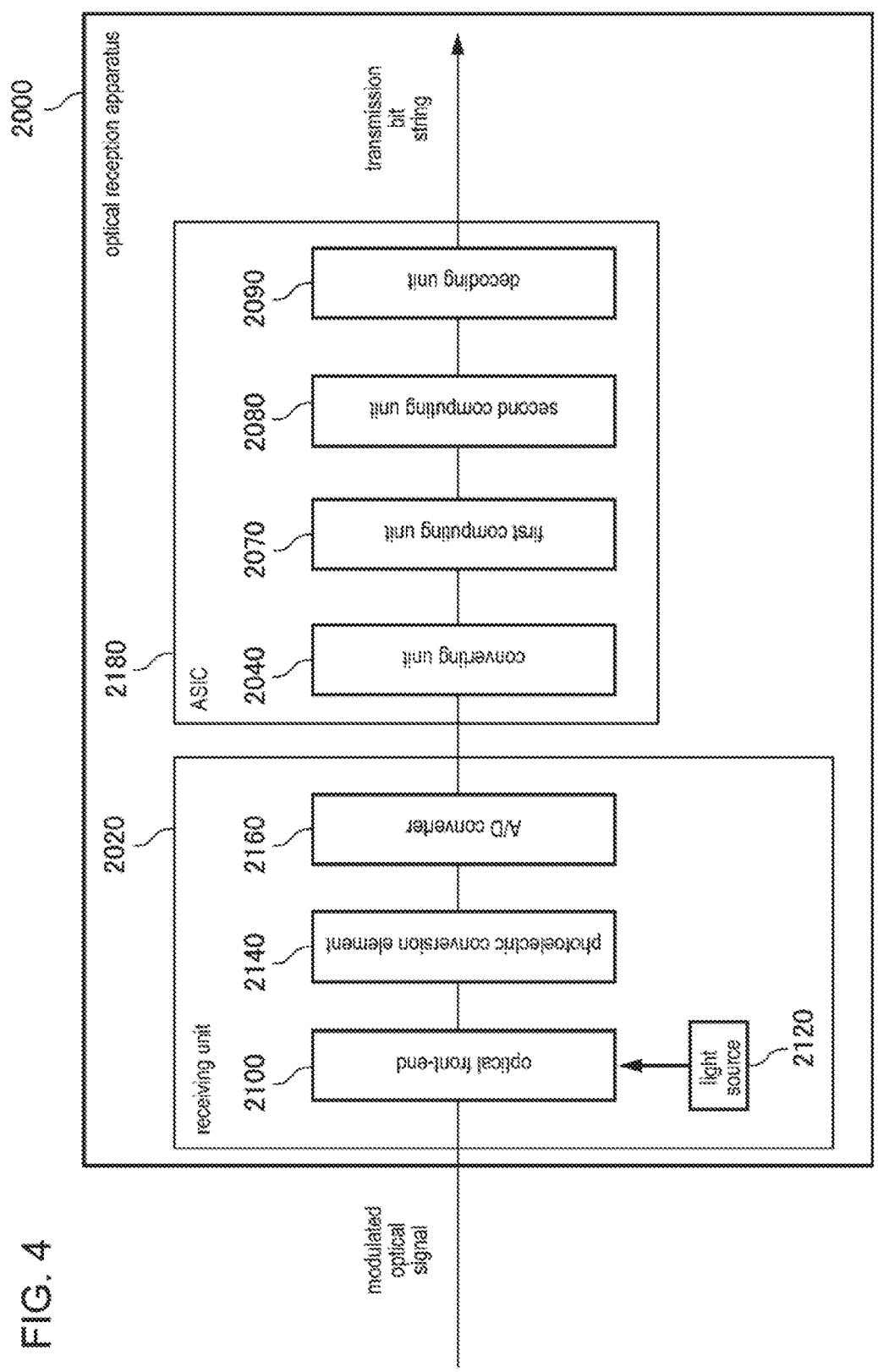
FIG. 4 is a diagram illustrating the detailed configuration of the optical reception apparatus.

FIG. 4 is a diagram illustrating the detailed configuration of the optical reception apparatus 2000. In FIG. 4, the receiving unit 2020 includes an optical front-end 2100, a light source 2120, a photoelectric conversion element 2140, and an analog-to-digital converter 2160.

The optical front-end 2100 generates a plurality of output lights by separating the modulated optical signal into two polarized components and causing each polarized component to interfere with local light output from the light source 2120. For example, the optical front-end 2100 is realized by an optical unit including an optical element such as a polarization splitter and an optical hybrid. For example, the light source 2120 is realized by the laser oscillator, and oscillates the local light. The local light has the same frequency as that of the laser light oscillated from the light source 110 of the optical transmission apparatus 100.

The photoelectric conversion element 2140 photoelectrically converts the plurality of output lights output from the optical front-end 2100, and outputs a plurality of analog signals.

The analog-to-digital converter 2160 converts the plurality of analog signals output from the photoelectric conversion element 2140 into digital signals. The digital signals output by the analog-to-digital converter 2160 represent a received frame Fr.

Note that, the receiving unit 2020 may perform wavelength dispersion compensation or polarization dispersion compensation on the digital signals output from the analog-to-digital converter 2160, and may output the digital signals obtained as the compensation result, as the received frame.

The converting unit 2040, the first computing unit 2070, the second computing unit 2080, and the decoding unit 2090 are implemented on the ASIC 2180. Note that, the analog-to-digital converter 2160 may be implemented on the ASIC.

<Flow of Processes>

Figure 5:
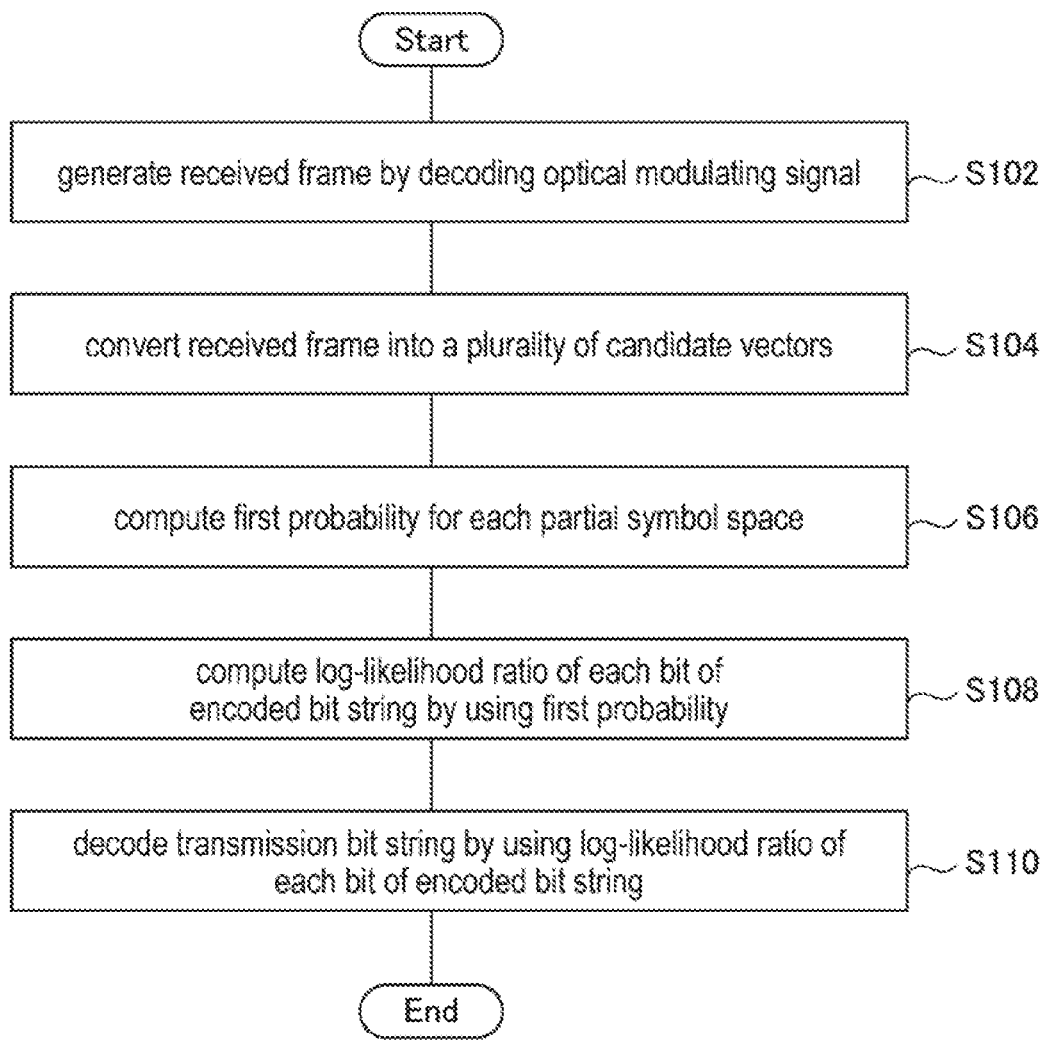
FIG. 5 is a flowchart illustrating a flow of processes performed by the optical reception apparatus of Example Embodiment 1.

FIG. 5 is a flowchart illustrating a flow of processes performed by the optical reception apparatus 2000 of Example Embodiment 1. The receiving unit 2020 generates the received frame Fr by receiving the modulated optical signal transmitted by the optical transmission apparatus 100 and demodulating the modulated optical signal (S102).

The converting unit 2040 converts the received frame Fr into a plurality of candidate vectors (S104). The first computing unit 2070 computes the first probability for each partial symbol space (S106).

The second computing unit 2080 computes the log-likelihood ratio of each bit of the encoded bit string by using the first probability (S108). The decoding unit 2090 computes the transmission bit string by performing the soft-decision decoding using each computed log-likelihood ratio (S110).

<As to Modulated Optical Signal being Transmitted>

As stated above, the modulated optical signal transmitted by the optical transmission apparatus 100 is generated by processes of (1) generating the transmission symbols S from the encoded bit string B, (2) generating the transmission frame Fs from the transmission symbol S, and (3) modulating the optical carrier wave in the transmission frame Fs. Hereinafter, these processes will be described in more detail.

<<Generation of Transmission Symbol S>>

The optical transmission apparatus 100 generates the m-dimensional transmission symbol by mapping the encoded bit string B to the m-dimensional symbol space. In this example, it is assumed that a rule for mapping the encoded bit string B to the symbol space is determined in advance.

Any rule is used as the rule for mapping the encoded bit string to the symbol space. For example, a BPSK, a quadrature phase-shift keying (QPSK), or 8-PSK can be used as this rule. An existing technology can be used as the technology for mapping the encoded bit string to the symbol space. Hereinafter, a case where the mapping using the BPSK is performed is illustrated.

It is assumed that the encoded bit string is a 2-bit string {b1, b2}. It is assumed that the encoded bit string is mapped to a two-dimensional transmission symbol S={s1, s2}.

Figure 6:
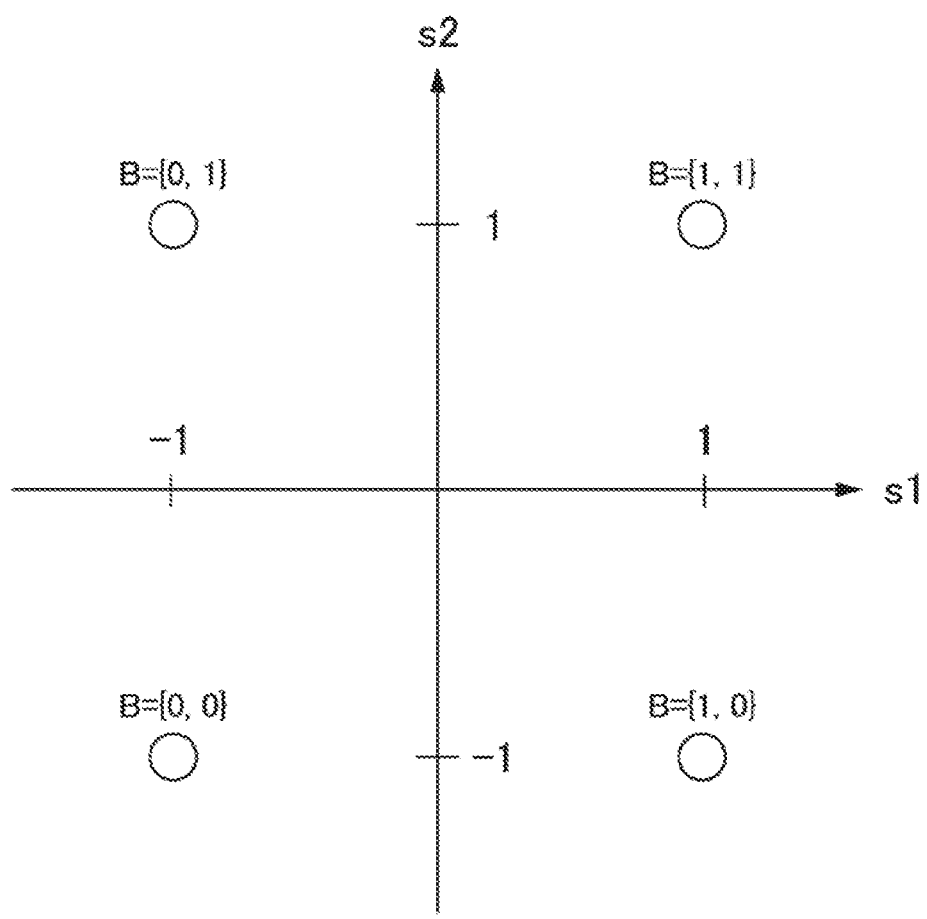
FIG. 6 is a diagram illustrating the mapping of an encoded bit string to a transmission symbol.

In this case, for example, the optical transmission apparatus 100 maps the bit b1 to s1, and maps the bit b2 to s2. FIG. 6 is a diagram illustrating the mapping of the encoded bit string to the transmission symbol. In the case of FIG. 6, s1=−1 in a case where b1=0, and s1=+1 in a case where b1=1. s2=−1 in a case where b2=0, and s2=+1 in a case where b2=1.

<<Generation of Transmission Frame>>

The optical transmission apparatus 100 generates the transmission frame Fs by mapping the m-dimensional transmission symbol S to the n-dimensional frame space. In this example, it is assumed that the rule of mapping the transmission symbol to the frame space is determined in advance.

Any rule is used as the rule for mapping the transmission symbol to the frame space. For example, Equation (1) is an example of the rule thereof. In this example, a four-dimensional transmission symbol S={s1, s2, s3, s4} is mapped to the two-dimensional transmission frame Fs={fs1, fs2}. Note that, ω is an imaginary number as a cube root of 1. In this example, the following matrix V is called a generator matrix.

Equation 1

$$F_s = \begin{bmatrix} fs_1 \\ fs_2 \end{bmatrix} = \begin{bmatrix} 1 & -\frac{1}{\sqrt{3}} & -\frac{1}{\sqrt{3}} & -\frac{1}{\sqrt{3}} \\ 0 & \frac{\sqrt{2}}{\sqrt{3}} & \frac{\sqrt{2}}{\sqrt{3}}\omega & \frac{\sqrt{2}}{\sqrt{3}}\omega^2 \end{bmatrix} \begin{bmatrix} s_1 \\ s_2 \\ s_3 \\ s_4 \end{bmatrix} = VS \quad (1)$$

<<Generation of Modulated Optical Signal>>

The optical transmission apparatus 100 generates the modulated optical signal by modulating the optical carrier wave in the n-dimensional transmission frame Fs. As the method of modulating the optical carrier wave in the transmission frame, a similar method to an existing method of modulating the optical carrier wave by the transmission symbol. For example, the modulated optical signal is generated by modulating one or more of an optical phase (an I component and a Q component), polarization (an X polarization component and a Y polarization component), a wavelength, and a time based on the transmission frame.

<Generation of Received Frame: S102>

The receiving unit 2020 generates the received frame Fr from the received modulated optical signal. The process performed by the receiving unit 2020 is a process for restoring the transmission frame used in the generation of the modulated optical signal by demodulating the modulated optical signal. As the method of obtaining the received frame by demodulating the modulated optical signal, a similar method to an existing method of obtaining the received frame by demodulating the modulated optical signal can be used.

<Conversion into Candidate Vectors: S104>

The converting unit 2040 converts the received frame Fr into a plurality of candidate vectors (S104). The candidate vectors are vectors belonging to the m-dimensional symbol space.

In this example, the transmission frame Fs is the n-dimensional vector generated using a generator matrix V from the transmission symbol S, whose number of dimensions m is larger than the number of dimensions n of the transmission frame. In a case where the m-dimensional transmission symbol S can be uniquely computed from the n-dimensional transmission frame Fr, the optical reception apparatus 2000 can restore the information transmitted by the optical transmission apparatus 100.

However, in general, in a case where the n-dimensional vector (n<m) is generated from the m-dimensional vector constituted by elements independent of each other, the m-dimensional original vector cannot be restored from the n-dimensional vector. The reason is that the number of column vectors of the generator matrix is m being larger than n, and therefore the column vectors of the generator matrix are not orthonormal basis.

However, there is a restriction that candidates of a value of each element si of the transmission symbol S depend on the rule of mapping the encoded bit string to the transmission symbol. For example, si is +1 or −1 in the example of BPSK.

Thus, the optical reception apparatus 2000 computes a finite number of candidates (the candidate vectors) of the transmission symbol transmitted by the optical transmission apparatus 100 from the received frame Fr by using this restriction. Hereinafter, the method thereof will be described in detail.

It is assumed that the candidate vector is represented by the four-dimensional vector c={c1, c2, c3, c4}. It is assumed that the values of si are +1 and −1. In this case, partial symbol spaces Πi represented by the following Equation (2) are present in the four-dimensional symbol space.

Equation 2

$$\begin{cases} \Pi_1 : c_1 = c_2 = c_3 \\ \Pi_2 : c_1 = c_2 = -c_3 \\ \Pi_3 : c_1 = -c_2 = c_3 \\ \Pi_4 : c_1 = -c_2 = -c_3 \end{cases} \quad (2)$$

The candidate vector corresponding to the received frame can be uniquely determined for each partial symbol space. Thus, the converting unit 2040 computes the candidate vector within the partial symbol space corresponding to the received frame for each of the plurality of partial symbol spaces determined in this manner.

It is assumed that the rule for computing the candidate vector belonging to each partial symbol space from the received frame is determined in advance. For example, it is assumed that the transmission frame is computed from the transmission symbol based on the rule of Equation (1). In this case, the candidate vector belonging to the partial symbol space satisfying c1=c2=c3 can be computed by the following Equation (3).

Equation 3

$$C_1 = \begin{bmatrix} c_{11} \\ c_{12} \\ c_{13} \\ c_{14} \end{bmatrix} = \begin{bmatrix} -\frac{1}{\sqrt{3}-1} & -\frac{\sqrt{6}+\sqrt{2}}{4}\omega \\ -\frac{1}{\sqrt{3}-1} & -\frac{\sqrt{6}+\sqrt{2}}{4}\omega \\ -\frac{1}{\sqrt{3}-1} & -\frac{\sqrt{6}+\sqrt{2}}{4}\omega \\ -\frac{1}{\sqrt{3}-1} & \frac{\sqrt{6}-\sqrt{2}}{4}\omega \end{bmatrix} \begin{bmatrix} fr_1 \\ fr_2 \end{bmatrix} = W_1 F_r \quad (3)$$

C1 represents the candidate vector belonging to the partial symbol space Π1. W1 represents a transformation matrix for obtaining the candidate vector C1 from the received frame. Hereinafter, transformation matrices corresponding to the partial symbol spaces Πi are referred to as dual frames Wi. The corresponding dual frame is also determined for other partial symbol spaces Π2 to Π4 in advance.

Figure 7:
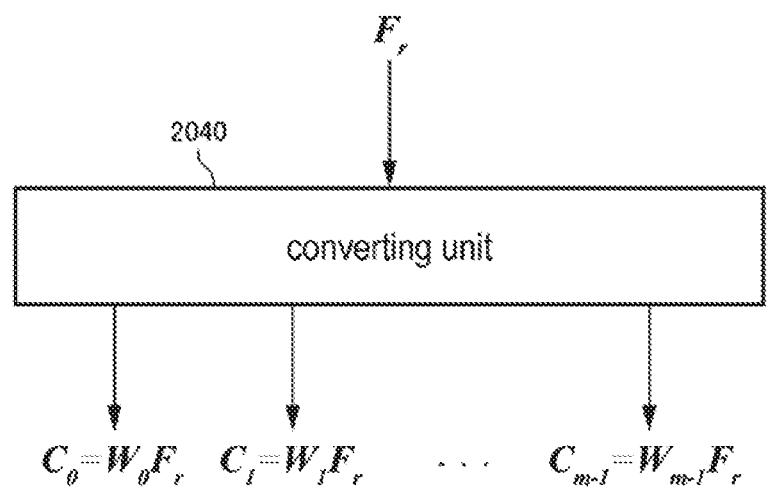
FIG. 7 is a conceptual diagram illustrating a scene in which candidate vectors $c_i$ are computed from a received frame Fr.

FIG. 7 is a conceptual diagram illustrating a scene in which the candidate vectors Ci are computed from the received frame Fr. The dual frames Wi are determined for the partial symbol spaces Πi in advance. The candidate vectors Ci belonging to the partial symbol spaces Πi are computed based on the dual frames Wi and the received frame Fr.

<For Soft-Decision Decoding: S106 to S110>

Due to the influence of noise caused by the communication path 200, the received frame Fr obtained from the received modulated optical signal does not match the transmission frame Fs transmitted by the optical transmission apparatus 100 in many cases. Thus, the optical reception apparatus 2000 restores the transmission bit string A by using the soft-decision decoding.

To do so, the optical reception apparatus 2000 performs processes of S106 to S110 of FIG. 4. Hereinafter, the processes will be described.

<<Computation of First Probability: S106>>

The first computing unit 2070 computes a first probability based on each of partial symbol spaces Πj. The first probability of a certain partial symbol space Πj is a probability of that the transmission symbol belonging to that partial symbol space Πj is transmitted by the optical transmission apparatus 100. This probability can be computed by the following Equation (4).

Equation 4

$$P(\Pi_j) = \sum_{S_{ji} \in \Pi_j} P(C_j | S_{ji}) \quad (4)$$

In this example, a conditional probability $P(C_j|S_{ji})$ can be computed by the following Equation (5), under the assumption that the noise that the modulated optical signal acquires from the communication path 200 follows a normal distribution.

Equation 5

$$P(C_j | S_{ji}) = \frac{1}{2\pi\sigma^2} \exp\left(\frac{\sum_i |C_j - S_{ji}|^2}{\sigma^2}\right) \quad (5)$$

<<Computation of Log-Likelihood Ratio: S108>>

The second computing unit 2080 computes the log-likelihood ratio for each encoded bit string bi. The log-likelihood ratio can be represented by the following Equation (6).

Equation 6

$$LLR(bi) = \log\frac{P(bi = 1 | F_r)}{P(bi = 0 | F_r)} \quad (6)$$

Equation (6) can be computed as illustrated in the following Equation (7) by using the first probability.

Equation 7

$$LLR(b_i) = \log\frac{P(b_i = 1 | F_r)}{P(b_i = 0 | F_r)} \quad (7)$$
$$= \log\frac{P(F_r | b_i = 1)}{P(F_r | b_i = 0)}$$
$$= \log\frac{\sum_j \left(P(\Pi_j) * \sum_{S_{jk} \in \Pi_j \cap b_i=1} P(C_j | S_{jk})\right)}{\sum_j \left(P(\Pi_j) * \sum_{S_{jk} \in \Pi_j \cap b_i=0} P(C_j | S_{jk})\right)}$$

In this example, whether each bit bi of the encoded bit string corresponding to each transmission symbol Sjk is 0 or 1 is determined based on the rule for mapping the encoded bit string B to the transmission symbol S.

Note that, in order for quick computation of log-likelihood ration, it is more preferable that an approximate equation of Equation (7) is used in the computation of the log-likelihood ratio. For example, the approximate equation is obtained by modifying Equation (7) by using a max-sum algorithm.

<<Computation of Transmission Bit String A: S110>>

The decoding unit 2090 computes the transmission bit string A by using the log-likelihood ratio computed based on each bit bi of the encoded bit string B. An existing technology for performing the soft-decision decoding using the log-likelihood ratio can be used in this computation.

Although the example embodiment of the present invention has been described with reference to the drawings, the example embodiment is an example of the present invention, and can adopt other various configurations.

This application claims priority to Japanese Patent Application 2016-197914, filed Oct. 6, 2016, the disclosure of which is incorporated herein.

What is claimed is:

1. An optical reception apparatus comprising:
    a receiving unit that generates an n-dimensional received vector by receiving and demodulating a modulated optical signal,
    wherein the modulated optical signal is generated by: generating a first transmission vector by mapping an encoded bit string obtained by encoding a transmission bit string to an m-dimensional first vector space; generating a second transmission vector by mapping the first transmission vector to an n-dimensional second vector space (n<m); and modulating an optical carrier wave using the second transmission vector,
    a plurality of partial spaces different from each other is determined in the first vector space due to a restriction on a value of the first transmission vector in the first vector space, and
    the optical reception apparatus further comprises:
    a converting unit that converts the received vector into a plurality of m-dimensional candidate vectors belonging to the partial spaces different from each other;
    a first computing unit that computes a probability of that the first transmission vector belonging to each partial space is transmitted, by using the candidate vector belonging to each partial space and the received vector for each partial space;

a second computing unit that computes a log-likelihood ratio of each bit of the encoded bit string by using the probability; and a decoding unit that computes the transmission bit string by using the computed log-likelihood ratio.

2. The optical reception apparatus according to claim 1, wherein a transformation matrix which converts the received vector into the candidate vector belonging to each partial space is defined for each of the plurality of partial spaces, and the converting unit computes each candidate vector by applying each transformation matrix to the received vector.

3. A control method performed by a computer, comprising:

generating an n-dimensional received vector by receiving and demodulating a modulated optical signal, wherein the modulated optical signal is generated by: generating a first transmission vector by mapping an encoded bit string obtained by encoding a transmission bit string to an m-dimensional first vector space; generating a second transmission vector by mapping the first transmission vector to an n-dimensional second vector space (n<m); and modulating an optical carrier wave using the second transmission vector, a plurality of partial spaces different from each other is determined in the first vector space due to a restriction on a value of the first transmission vector in the first vector space, and the control method further comprises:

converting the received vector into a plurality of m-dimensional candidate vectors belonging to the partial spaces different from each other;

computing a probability of that the first transmission vector belonging to each partial space is transmitted, by using the candidate vector belonging to each partial space and the received vector for each partial space;

computing a log-likelihood ratio of each bit of the encoded bit string by using the probability; and computing the transmission bit string by using the computed log-likelihood ratio.

4. The control method according to claim 3, wherein a transformation matrix which converts the received vector into the candidate vector belonging to each partial space is defined for each of the plurality of partial spaces, and the control method further comprises computing each candidate vector by applying each transformation matrix to the received vector.

* * * * *